US006243273B1

(12) United States Patent
Beun et al.

(10) Patent No.: US 6,243,273 B1
(45) Date of Patent: Jun. 5, 2001

(54) MINI-BACKPLANE "T" ASSEMBLY (75) Inventors: Roger Arthur Beun, Kanata (CA); William Locke Craig, Jr., Durham, NC (US); Joseph John Lommen, Nepean (CA); Janice Parker Broniak; Derek Chunchi Liou, both of Cary, NC (US); Jeffrey Scott Taylor, Apex, NC (US)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/388,366

(22) Filed: Sep. 1, 1999

(51) Int. Cl.[7] .................................................. B65D 43/08
(52) U.S. Cl. ...................... 361/796; 361/788; 361/756; 361/704; 361/741; 361/796; 361/797; 439/325; 439/326; 439/327; 439/260; 439/261; 439/630; 439/631
(58) Field of Search .............................. 439/65, 325–328, 439/260–261, 267, 630–632; 361/788, 756, 796, 797, 727, 741, 704

(56) References Cited

U.S. PATENT DOCUMENTS

| | | | | |
|---|---|---|---|---|
| 5,128,830 | * | 7/1992 | Deluca et al. ....................... | 361/383 |
| 5,411,416 | | 5/1995 | Balon et al. ........................ | 439/639 |
| 5,757,617 | * | 5/1998 | Sherry ................................ | 361/685 |
| 6,104,613 | * | 8/2000 | Urda et al. ......................... | 361/704 |

OTHER PUBLICATIONS

International Search Report dated Dec. 5, 2000.
"High Capacity Lineup Dramatically Boosts Efficiency, Lowers Network Costs For Operators," Discovery, vol. 48, Fourth Quarter 1998, pp. 12–16, XP000667405, ISSN: 0780–3931.
Rosenlund, H., "The Base Transceiver Station (BTS) To Base Station Controller Interface A–bis," Proceedings of Digital Cellular Radio Conference, Oct. 1, 1998, XP000198903.
Carrie, A., Cellmer, J. and Marciguey, M., "MATRACOM 9200 ET AXE 10: Un système flexible pour les réseux GSM," Commutation et Transmission, FR, Sotelec, Paris, vol. 13, No. 1, 1991, pp. 5–18, XP000247526, ISSN: 0242–1283.

* cited by examiner

Primary Examiner—Jeffrey Gaffin
Assistant Examiner—Thanh Y. Tran
(74) Attorney, Agent, or Firm—Winthrow & Terranova, P.L.L.C (57) ABSTRACT

Apparatus for mounting retrofit equipment modules into the equipment mounting cabinetry of an installed modular equipment signal network includes an interface module and mini-backplane combination which is adapted for insertion into the equipment cabinetry with electrical signal connection of the mini-backplane to the cabinetry master backplane, and for mounting retrofit modules inserted therein in electrical signal interconnectivity with others of the network equipment modules.

17 Claims, 7 Drawing Sheets

MINI-BACKPLANE "T" ASSEMBLY

CROSS REFERENCE TO RELATED APPLICATIONS

Some of the material disclosed and claimed in this application is also disclosed in a commonly owned, copending U.S. patent application Ser. No. (Docket No. SN 0245) entitled: Way Finding with an Interactive Faceplate, filed on even date herewith by Janice M. Parker, et al

FIELD OF INVENTION

This invention relates to modular signal network equipment, and more particularly to apparatus for installing retrofit equipment modules into modular equipment mounting cabinets.

BACKGROUND OF THE INVENTION

With the rapid growth in communications technologies and the increased demand of network users for improved signal speed and reliability, network operators are faced with a constant need to upgrade network performance. The upgrades may be the result of improved technology or the availability of expanded system features. Other than in the case of generation changes where an entire system is replaced, these system upgrades are provided incrementally; generally through the retrofit of certain elements of the network circuitry with improved designs of those elements. With modular equipment, where function is often segregated into individual modules, the new design features can be installed in new version modules which are form and fit compatible with those of the existing installation.

There are, however, certain improvements which necessarily compromise form and fit compatibility, such as where a new design expands a particular function, requiring expanded signal connectivity to a module. This expanded connectivity can arise from a need for a greater number of input data sources or for added output load requirements. In these instantances the existing plant wiring is the bottleneck and some manner of plant wiring modification is required. This of course increases the cost of retrofit and may jeopardize the form and fit of the existing installed equipment. With changes in signal protocols and improvements in communications technologies, the frequency of occurrence of this type event is increasing. It is desirable, therefore, to provide a means to retrofit these type improvements into existing systems without the need for plant modifications.

DISCLOSURE OF THE INVENTION

The present invention is to apparatus capable of mounting retrofit modules to the mounting cabinetry of an installed modular equipment network. According to one feature of the invention the apparatus includes a combination mini-backplane and interface module which together provide surrogate mounting of the retrofit module with expanded connectivity external of the cabinet but with full functional connection with other equipment modules of the network. In further accord with this feature of the invention the present invention is configurable in either or both of the interface module and the mini-backplane to be adaptable for use in different network applications.

According to another feature of the invention, the apparatus is capable of mounting redundant, first and second retrofit modules in a manner which provides duplicate expanded connectivity and duplicate full functional connection to the network for each retrofit module, thereby providing for the addition of a high reliability retrofit function. In further accord with this feature of the invention the present mounting apparatus itself provides for full interconnectivity between the primary and secondary retrofit modules and for connection of each module with the network.

The mini-backplane T assembly of the present invention provides for the mounting of retrofit equipment modules into the existing equipment mounting cabinetry of an installed modular equipment signal network with minimum cost and disruption of the network operational The assembly includes an interface module and mini-backplane combination which is adapted for insertion into the equipment cabinetry with electrical signal connection of the mini-backplane to the cabinetry master backplane, and for mounting retrofit modules inserted therein in electrical signal interconnectivity with others of the network equipment modules. The interface module is capable of receiving expanded network signal lines external of the mounting cabinet backplane thereby providing for expanded connectivity of the retrofit modules with no modification of the cabinet itself.

These and other aspects and features of the present invention will become apparent to those ordinarily skilled in the art upon review of the following description of specific embodiments of the invention in conjunction with the accompanying Figures.

BEST MODE FOR CARRYING OUT THE INVENTION

In the following description of a best mode embodiment, the present invention is described in connection with the retrofit of an installed GSM protocol wireless telephone system for the purpose of expanding the function and connectivity of one element of the system. It should be understood, however, that the invention is not limited to wireless telephone systems or even to telephone systems in general, but may be used in connection with a number of different type signal network applications, and may also have utility in other generalized applications.

Figure 2:
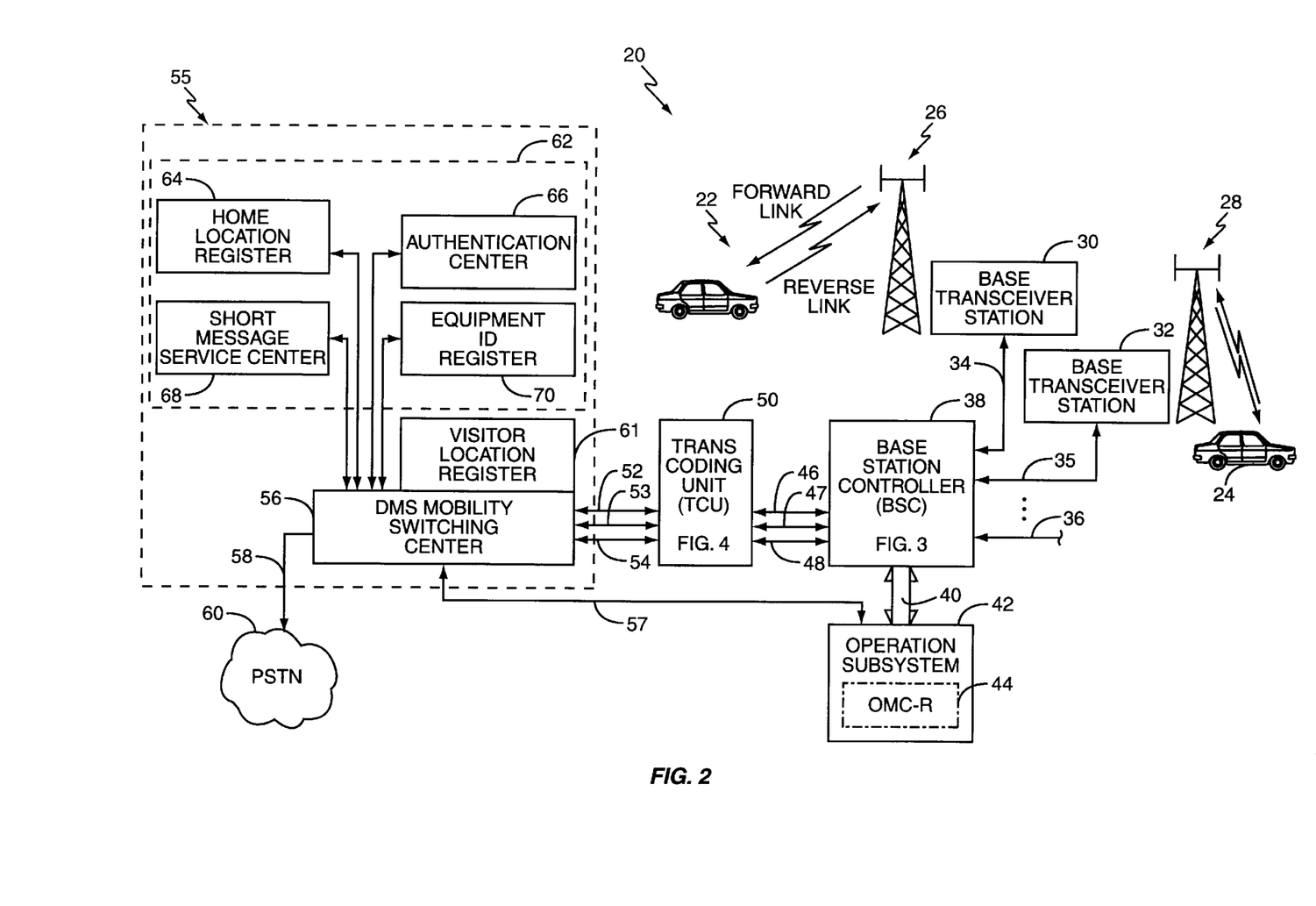
FIG. 2, is a schematic block diagram of a wireless telephone network embodiment in which the present invention may be used.

Referring first to FIG. 2, which is a system block diagram of a known type wireless communication system 20, such as the Nortel Networks Model PCS Digital Cellular System, in which mobile handset users 22, 24 communicate through antennae 26, 28 with base transceiver stations (BTS) 30, 32. The BTS 30, 32 are connected through network lines 34–36 to a base station controller (BSC) 38. The lines may be dual twisted pair copper wire, or coaxial cable both which provide a differential signal transmission format. The BSC 38 manages the radio resources of the BTS 30, 32, including hand-offs, traffic concentration and radio channel allocation, and communicates through lines 40 with the network's operation subsystem 42. The subsystem 42 includes the Operations and Maintenance Center-Radio (OMC-R) 44, which is a graphical interface that provides operation and maintenance functions, including performance management of the BSC.

The format of the digital signal transmission from the BTS 30, 32 may be in a DS-1 (or T1) protocol or, alternately, a PCM 30 (or E1) protocol. The BSC 38 provides the BTS signals on lines 46–48 to a transcoding unit (TCU) 50 at wireless system transmission speeds of 8 Kbps or 16 Kbps. The TCU 50 translates the wireless system signal speed into 64 Kbps m-law speech, thereby providing a minimum 4-to-1 expansion of traffic capacity.

The BTS 30, 32, BSC 38, operation subsystem 42 and TCU 50 collectively comprise the Base Station Subsystem (BSS), which is the interface between the mobile handset users and the Network Switching Subsystem (NSS) 55. The NSS 55 provides the switching, mobility, and subscriber management required for operation of the wireless system. It includes the network DMS (Digital Multiplex Switch) Mobility Switching Center (DMS-MSC) 56 which is connected through lines 57 to the Operation Subsystem 42 and through lines 58 to the public switch telephone network (PSTN) 60 to coordinate the call setup between the PSTN and the BSS. The DMS-MSC 56 also includes a visitor location register (VLR) 61 which stores subscriber information.

The NSS 55 also includes an intelligent network (IN) 62, which provides databases and computer signal processing for subscriber and equipment validation, subscriber tracking, and service delivery. Components of the IN 62 include: a home location register (HLR) 64, an authentication center 66, a short message service (SMS) center 68, and an equipment identity register 70. All of which are connected to the DMS-MSC 56.

As described in the hereinbefore cross referenced, copending application to Parker et al, which is hereby incorporated by reference herein, a modification was made to system 20 to expand the capability of the system operator to quickly access and isolate signal line faults. A number of electronics modules (IEMs) was added by retrofit to expand the system's diagnostic function; i.e. to perform real time monitoring of signal quality on each of the network signal lines and to display performance monitored results on an equipment faceplate. Each of the network signal lines entering the BSC and TCU equipment site were routed through one of a plurality of added IEM modules. This change also expanded diagnostic features by providing an interactive faceplate at each IEM. The faceplate included a number of operator visible displays for visual reporting of signal faults and alarm conditions detected by the IEM. In addition, due to the increased circuit complexity and circuit component density of the IEM, it was considered necessary to use dual redundant IEMs to ensure system reliability, thereby further increasing the required connectivity beyond that available in the master backplane of the equipment mounting cabinetry. The mini-backplane T assembly of the present invention provided the means of adding the IEMs.

Figure 3:
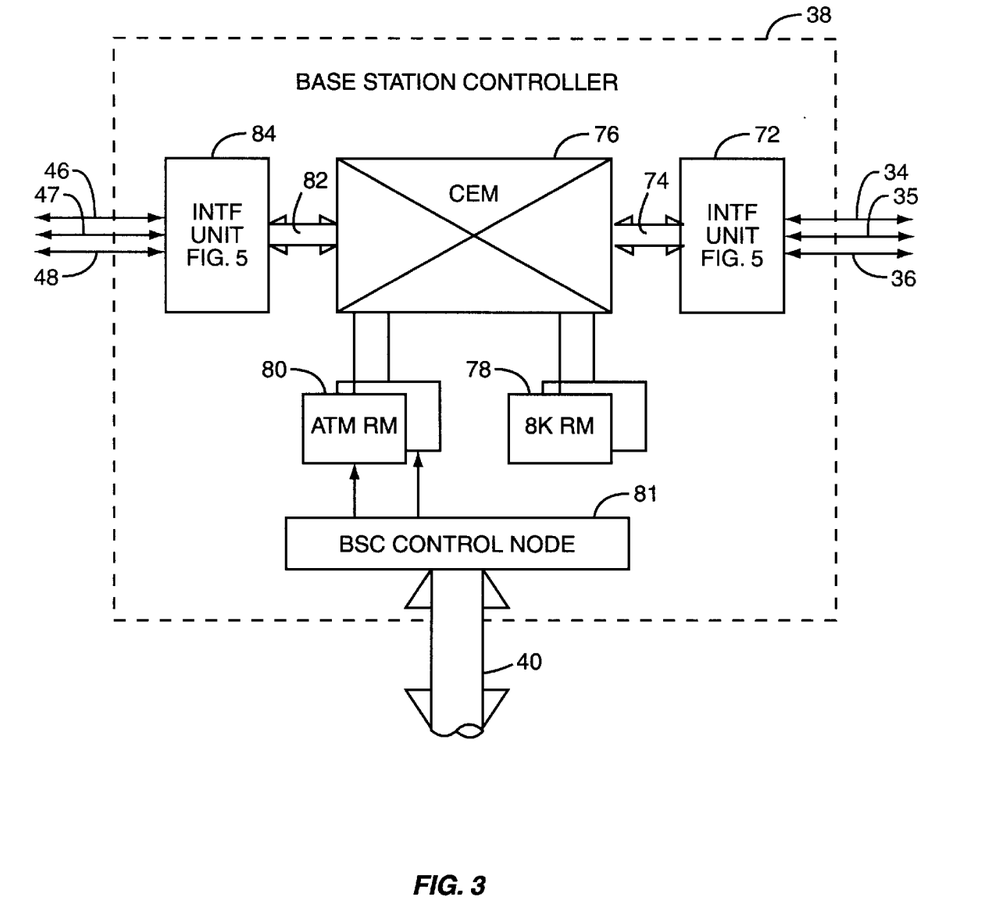
FIG. 3, is a schematic block diagram of one portion of the embodiment of FIG. 2.

The IEMs where added as Low Speed Access (LSA) equipment at the interface of the BSC 38 and TCU 50 equipment with the network lines. This, together with the availability of loop back testing of each line, allowed the system operator to isolate signal faults to either the network equipment (at the BSC or TCU) or to the network lines. FIG. 3 is a system block diagram of the BSC 38, which receives the network lines 34–36 at the interface 72. The signal lines are pass from the interface 72 through lines 74 to the BSC Common Equipment Module (CEM) 76, which provides the central processing for the BSC as well as: time switching of the pulse code modulated (PCM) data, routing of the signal line data between the interface unit 72 and the remote module (RM) time switch 78, and communicating through the ATM resource module (RM) interface 80 with the ATM backplane (not shown) of the BSC Control Node 81. The CEM passes the voice and data channel signals through lines 82 and through a second interface 84 onto lines 46–48 to the TCU 50 (FIG. 2).

Figure 4:
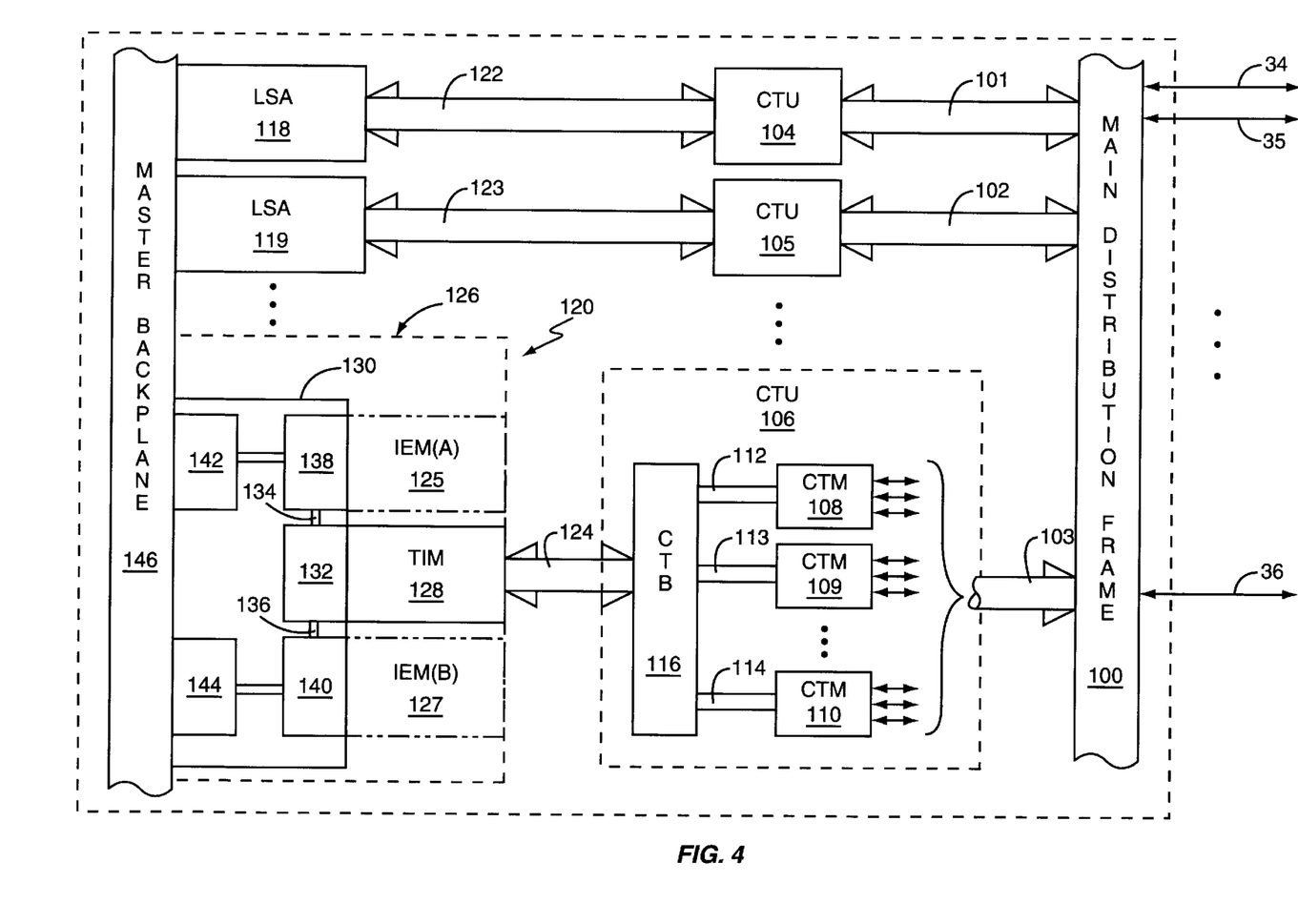
FIG. 4, is a detailed schematic diagram of one element of the portion illustrated in FIG. 3.

The interface 72 is illustrative of each of the interfaces added to the BSC 38 and TCU 50. Referring to FIG. 4, the interface 72 receives the network signal lines 34–36 from the BTS 30, 32 (FIG. 2) at a Main Distribution Frame (MDF) 100, which functions as a transition point between the outside lines and the BSC hardware. The DS-1 or PCM 30 network lines are routed in sub-groups of lines 101–103 to associated ones of a plurality of Cable Transition Units (CTUs) 104–106. Each CTU, as shown by CTU 106, includes a plurality of Cable Transition Modules (CTMs) 108–110. The CTMs provide secondary surge protection (primary surge protection, including lightening protection being provided at the MDF 100), passive impedance matching electronics in the case of PCM 30 coax or DS-1 twisted pair, and manual loopback switches for each connected network line. As known, the loopback switches permit isolation of trunk line signal faults to the BSC equipment itself or to the network lines 34–36.

The number of network lines connected through each CTU 104–106 is a function of the system signal bandwidth and the network signal protocol. Each CTU is capable of receiving either 28 DS-1 type signals or 21 PCM 30 type signals. Assuming a PCM 30 protocol the CTU receives 21 lines, which are divided between the CTMs. Each CTM is a multilayer circuit board capable of supporting up to three PCM 30 lines, either twisted pair, or coaxial, for a maximum of seven CTMs per CTU. The network signals from the CTMs 108–110 are coupled through lines 112–114 to a Cable Transition Board (CTB) 116 and onto lines 124 to Low Speed Access (LSA) modules 118, 119, 120.

As described above the LSAs represent the retrofitted function for system 20 and, as shown by LSA 120, each includes dual redundant IEM modules 125, 127 (shown in phantom) mounted into the mini-backplane T assembly 126 of the present invention. The mini-backplane assembly 126 is shown schematically, to include a Transition Interface Module (TIM) 128 which is removably, but fixedly attached to a mini-backplane 130. In the illustrated embodiment the TIM 128 provides passive EMI filtering of each network line and presents the lines to a signal connector 132 of the backplane 130. The backplane routes the network signal lines to each IEM through duplicate network signal line wiring 134, 136 to signal connectors 138, 140, each of which are adapted to receive an associated one of the IEMs 125, 127. Each IEM provides its signal output, which includes the network signal lines to signal connectors 142, 144 which are adapted to functionally engage associated signal connectors of a master backplane 146 of the equipment mounting cabinet 148 of FIG. 5.

Figure 5:
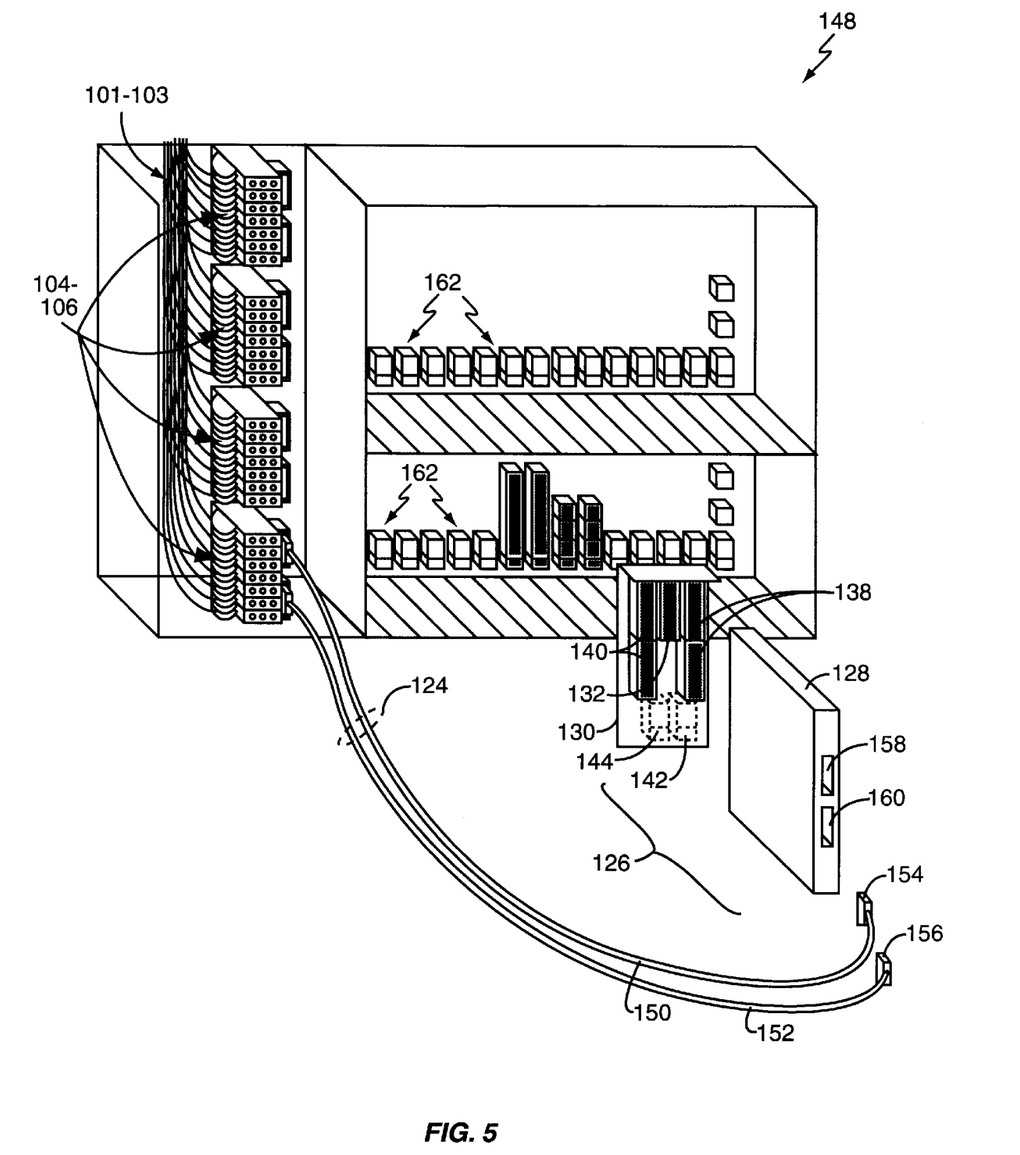
FIG. 5, is a partially exploded, perspective illustration of equipment mounting cabinetry in which the assembly of FIG. 1 may be used.

Referring to FIG. 5, which is a figurative perspective illustration, not to scale, of equipment mounting cabinetry of the type used for the modular equipment of the wireless network 20. The illustration is only intended to show the relational fit of the mini-backplane assembly to the system equipment cabinet. Using the same reference numerals for the same elements shown in FIG. 4, the mini-backplane T assembly 126 is shown in an exploded view which separates the TM 128 from the mini-backplane 130. The TIM receives the network signal lines 124 embodied in separate transmit and receive cables 150, 152 which are connected through cable connectors 154, 156 and 158, 160 to the TIM.

Figure 6:
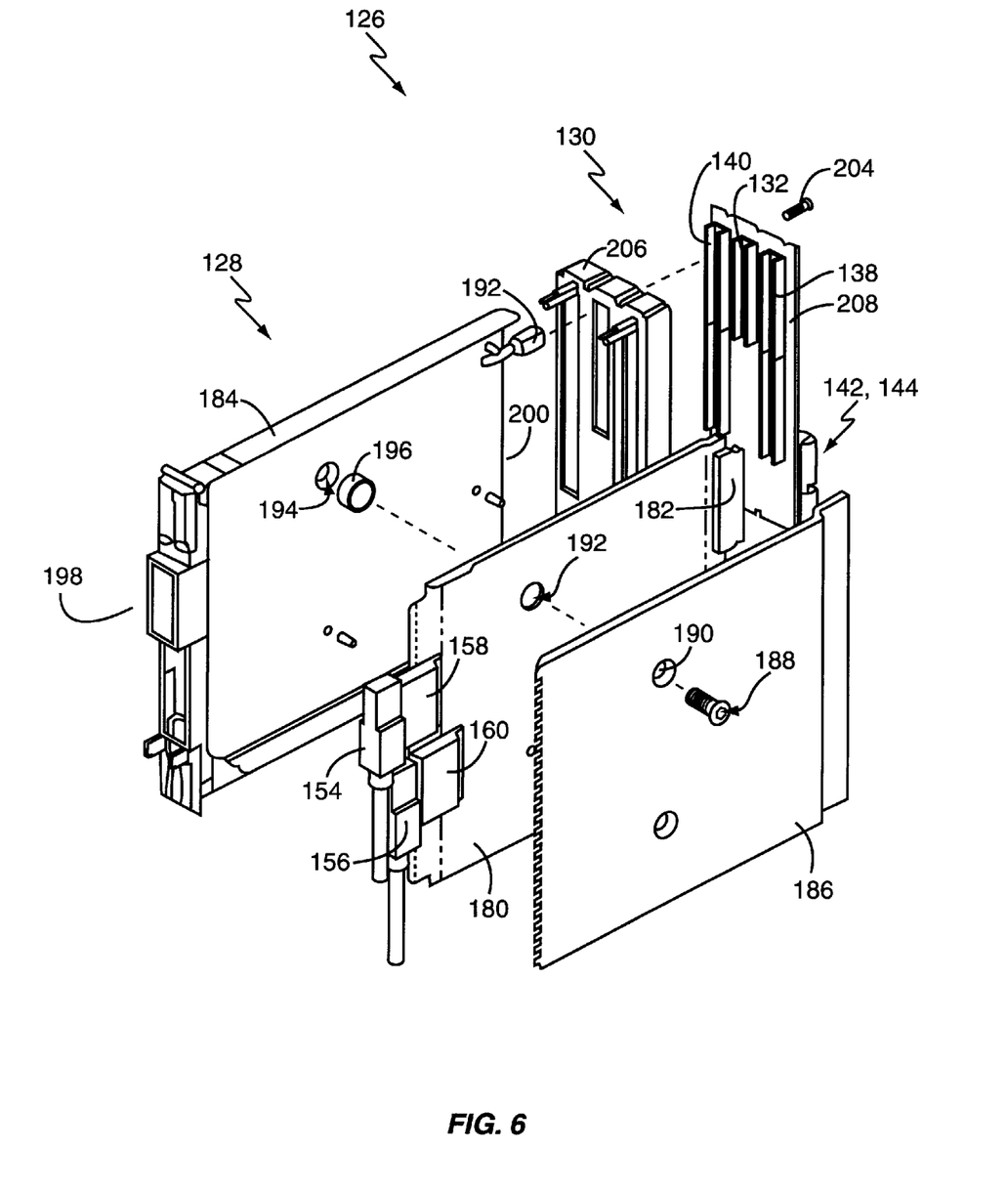
FIG. 6 is an exploded perspective view of the assembly of FIG. 1.

The TIM housing fixedly attaches to the mini-backplane housing 206 on FIG. 6 causing the TIM signal connector 182 (FIG. 6) to engage the mini-backplane connector 132. With installation of the mini-backplane assembly 126 into the cabinet 148, the backplane signal connectors 142, 144 (shown in phantom as on the reverse side of the mini-backplane 130) engage the associated ones of the signal connectors 162 of the master backplane 146 of the cabinet 148. With the assembly installed in the cabinet, the IEMs (125, 127, FIG. 4) are inserted into the assembly 126 and the IEM signal connectors engage the mini-backplane signal connectors 138, 140.

Figure 1:
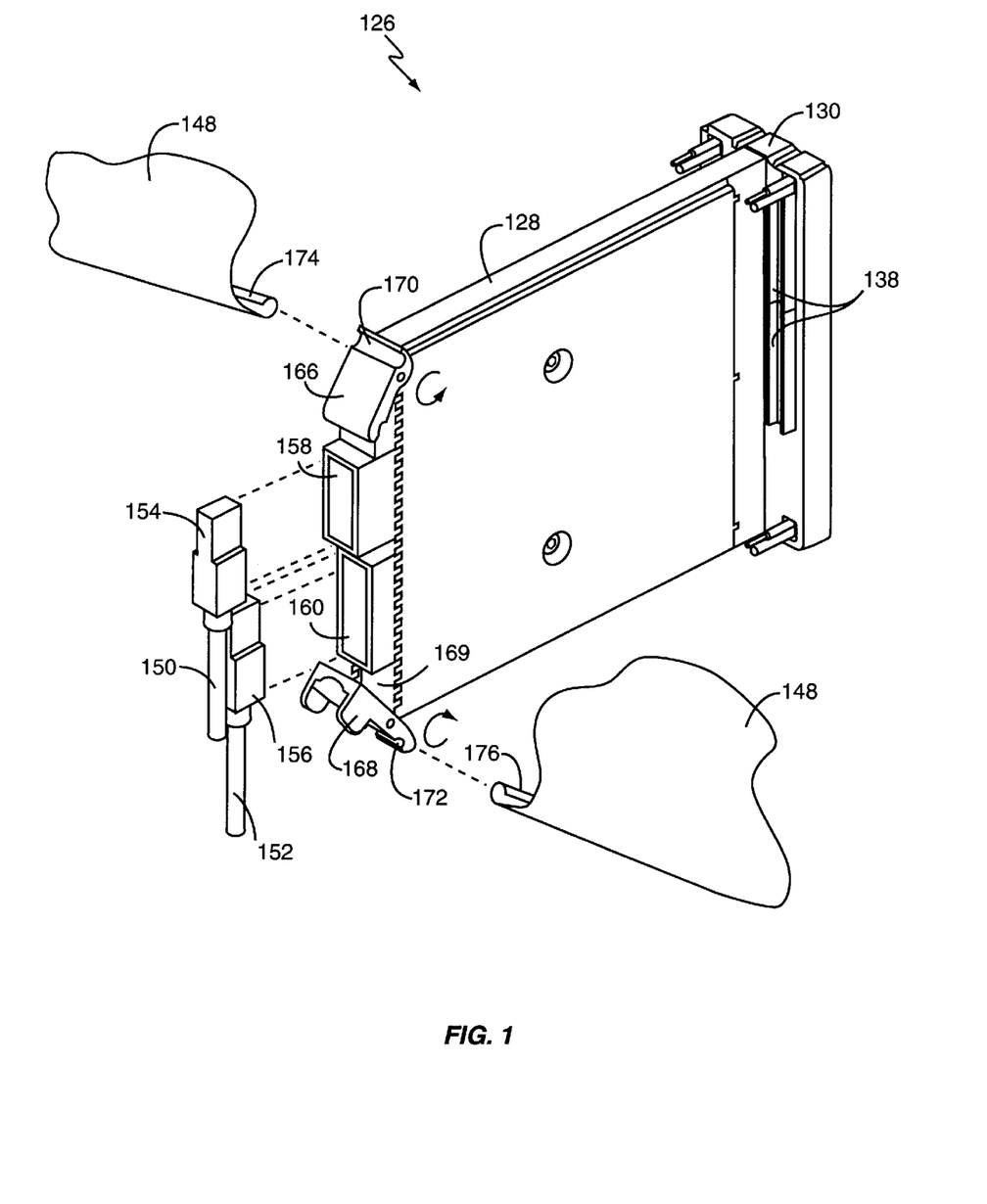
FIG. 1, is a perspective illustration of a best mode embodiment of a mini-backplane T assembly according to the present invention.

Referring now to FIG. 1, which is a perspective illustration of the present mini-backplane T assembly. As in FIG. 5, the same reference numbers are used to identify the same elements. The mini-backplane assembly 126 includes the TIM 128, which is mounted to the mini-backplane housing 130 and which receives the network signal line connectors 154, 156 at the TIM signal input connectors 158, 160. As described hereinbefore, the assembly 126 is adapted to be slidably inserted into the cabinet until the mini-backplane signal connectors 142, 144 (FIG. 5) engage the associated signal connectors 162 of the cabinet master backplane 146 (FIG. 5). With the assembly fully inserted, lock latches (or "thumb latches") 166, 168 which are hinge mounted on the TIM front panel 169, also referred to as the TIM near side end wall, are rotated in the manner shown by the latch adjacent rotational arrows, to engage a channel 170, 172 formed in each of the locklatchs with shelf rails 174, 176 formed on the top and bottom of the cabinet 148. When fully depressed the locklatches 168, 170 are held in tension, snugged against the near side end wall 169, thereby securing the assembly 126 in its cabinet mounting.

FIG. 6 is an exploded perspective view of the mini-backplane assembly 126 showing the major elements of the TIM 128 and mini-backplane 130. The TIM includes a circuit board assembly 180 with mounted cable signal connectors 158, 160, and the TIM signal connector 182, which connects to the mini-backplane connector 132. In a best mode embodiment the circuit board 180 is enclosed in a sheet metal housing, comprising a base 184 and a top 186. The top 186 is fastened to the base 184 with fasteners 188, preferably hex screws 188, which are connected through apertures 190 in the top, 192 in the board 180 and 194 in the base 184. To maintain spacing within the housing, spacers 196 are used to maintain the space to-part-distance of the top to the base.

The base 184 includes the TIM near side end wall 198 and far side end wall 200. The far side end wall includes a fastener assembly 202, a threaded housing which is fastened to the TIM base 184 and which is adapted to engage a hex screw 204 which passes through the mini-backplane f0 and engages the TIM to a housing 206 of the assembly. The housing 206 is adapted to receive the mini-backplane assembly connectors 132, 138, 140, and the mini-backplane 208. Although the TIM housing base 184 and top 186 are shown in a best mode embodiment to comprise sheet metal, it should be understood that various other type sheet materials may be used as deemed suitable for use in a given application by those skilled in the art.

In FIG. 6 the mini-backplane connectors 142, 144 are electrically connected to the connectors 132, 138 and 140 through the backplane 208. The backplane is a multilayer printed circuit board in which the conductive signal paths are arranged as copper traces (not shown) on several different ones of the multilayers. The actual arrangement and layout of the traces is dependent on the particular application. In the system 20 application layout considerations included ensuring that no vias were used with the network signal lines so as to ensure signal integrity. In addition the copper trace widths were selected to maintain a nominal network signal impedance. With the wireless telephone system application the network signal traces were adjusted to maintain a nominal 120 ohm differential impedance between the trunk line tip and ring.

Figure 7:
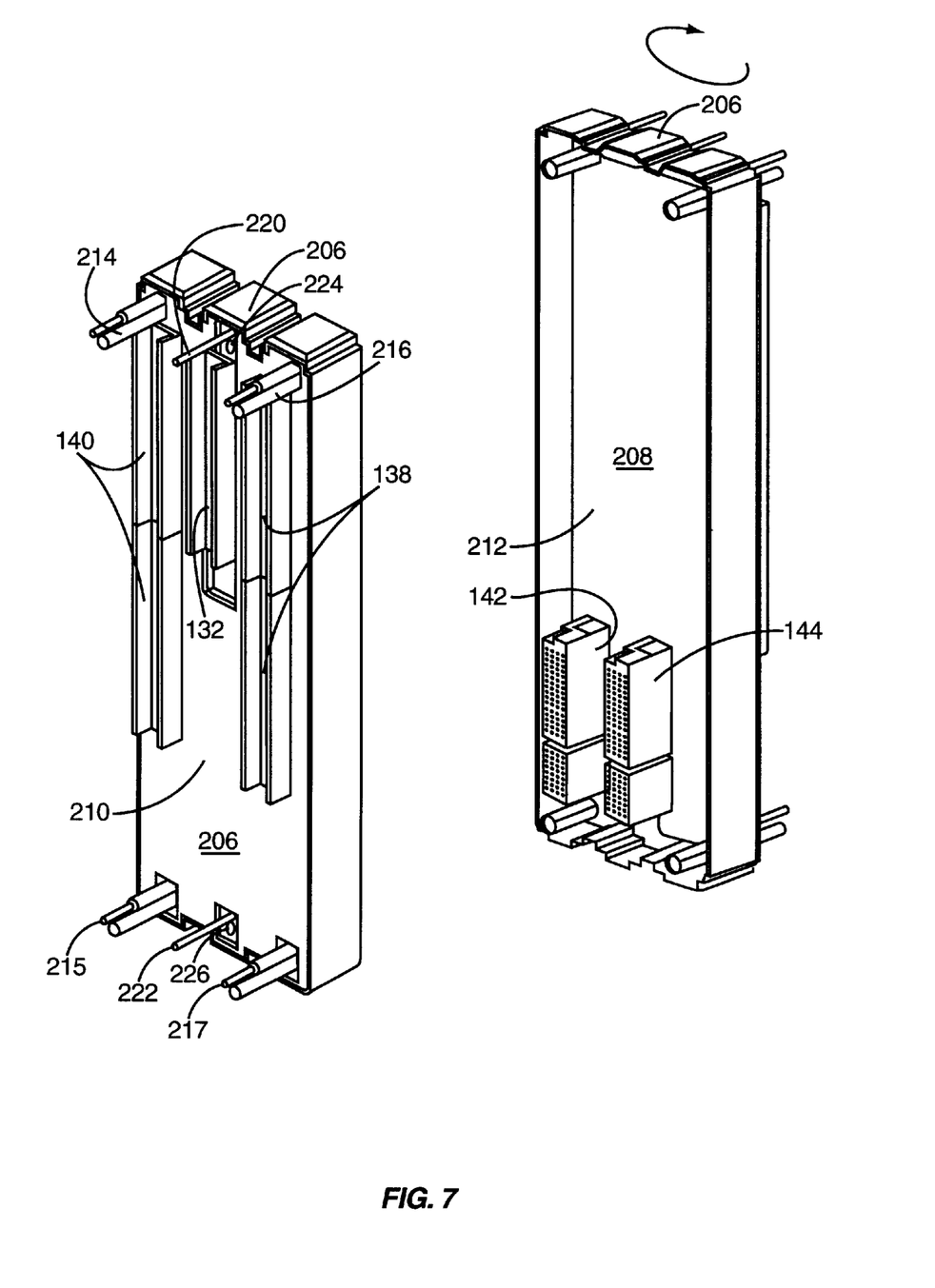
FIG. 7 is a perspective illustration of one element of the assembly of FIG. 6.

FIG. 7 is a perspective illustration of the mini-backplane itself showing the TIM mating side 210 and the master backplane (or cabinet mounting side) 212. The TIM mounting side includes the signal connectors 132, 138, and 140 which are male connectors. The cabinet mounting side 212 includes connectors 142, 144 which are female connectors. The mini-backplane frame 206 includes guide pins 214, 215, 216, 217 which are adapted for insert into guide channels in each of the IEM modules. Similarly, the TIM interface includes guides 220, 222 which perform the similar function with the TIM. Adjacent each of the TIM guide pins 220, 222 are the apertures or screw holes 224, 226 through which the hex screws (204, FIG. 6) pass to engage the threaded housing (202, FIG. 6) of the TIM.

The mini-backplane assembly of the present invention provides for the retrofit of new design modules to existing equipment with minimum cost. It allows for the installation of expanded connectivity retrofit modules without mechanical modification or wiring changes to the installed mounting cabinetry. The TIM is also configuration adaptable in that various functions, both active and passive, may be added to the circuit board to support the retrofit, as may be necessary or deemed desirable. All of which adds to its versatility in facilitating retrofit modification of installed systems.

The mechanical configuration of the present mini-backplane also simplifies its installation into the system by providing a front located mechanical latch which secures the assembly into the cabinet. There is no requirement for rear access to the cabinet for installation or removal. Everything may be done from the front access of the cabinet thereby facilitating the quick replacement of the retrofit modules installed in the assembly, as may be necessary in the event of a functional failure, so as to minimize the disruption to network traffic. In addition, and a distinctive feature of the mini-backplane is the ease with which it may be inserted and removed; without the need for tools of any type.

Similarly, although the invention has been shown and described with respect to a best mode embodiment thereof, it should be understood by those skilled in the art that various changes, omissions, and additions may be made to the form and detail of the disclosed embodiment without departing from the spirit and scope of the invention, as recited in the following claims.

We claim:

1. Apparatus, for molting retrofit equipment modules in a mounting cabinet of a modular equipment network, the mounting cabinet being of the type in which connectors of equipment modules are inserted in the mounting cabinet in side by side orientation to engage master backplane signal connectors coupled to a master backplane within the cabinet, said apparatus comprising:

a mini-backplane, having first and second major surfaces opposing one another and extending along a common periphery, said first major surface having one or more first signal connectors adapted to releasably engage a signal connector of a retrofit module, said second major surface having one or more second signal connectors adapted to releasably engage one or more of said master backplane signal connectors, said first major surface further having a third signal connector being electrically connected to said first signal connectors, said second signal connectors being electrically connected to corresponding ones of said first signal connectors;

an interface module, having an interface module connector and a housing, said interface module connector adapted to engage said third signal connector, said housing including a near side end wall spaced longitudinally from a far side end wall and at least one side wall extending between the far side end wall and the near side end wall; and a peripheral frame, adapted to fixedly engage said common periphery of said mini-backplane and said far side end wall of said interface module in a mainer to fixedly position said at least one side wall of said interface module in a substantially orthogonal orientation to said first and second major surfaces of said mini-backplane, to provide a mounting apparatus which is adapted to engage said master backplane connectors of said master backplane with said second signal connectors and to receive a retrofit module adjacent to said interface module by engaging said signal connector of the retrofit module with one of said first signal connectors, thereby interconnecting the retrofit module with other cabinet mounted modules.

2. The apparatus of claim 1, wherein:

said interface module further comprises an interface circuit board adapted for mounting within said housing, said housing further including a network signal connector disposed on said interface module, said network signal connector being adapted to receive network signal lines external of the master backplane and for providing said network signal lines through said printed circuit board to said interface module connector; and one or more of said first signal connectors of said mini-backplane are adapted to releasably engage said interface module connector, said mini-backplane being further adapted to distribute some and, alternately, to distribute all of the network signals between said first signal connectors, from said interface module connector to said signal connector of the retrofit module, thereby providing the retrofit module with a greater signal connectivity than is available through connection to the master backplane.

3. The apparatus of claim 2, wherein:

said mini-backplane comprises a printed circuit board having one or more layers therein, each of said one or more layers including one or more signal conductors for electrically interconnecting said first signal connectors to said third signal connector in a manner to provide signal interconnection of said interface module connector with said signal connector of said retrofit module, and for electrically connecting some or all of said first signal connectors with said second signal connectors.

4. The apparatus of claim 2, wherein:

said printed circuit board is adapted to perform signal conditioning of the network signals conducted therethrough.

5. The apparatus of claim 4, wherein said signal conditioning comprises limiting the signal amplitude of the network signals to a selected magnitude.

6. The apparatus of claim 1, wherein:

said interface module further includes latching means disposed thereon, said latching means being adapted for releasable engagement to a portion of the mounting cabinet to provide, when engaged, the securing of said mounting apparatus within the cabinet.

7. The apparatus of claim 6, wherein:

said latching means includes one or more thumb latches which are pivotally mounted on said housing of said interface module and which include a latching end adapted to contact, with said apparatus inserted in the mounting cabinet, a portion of the mounting cabinet, said latching end thereafter maintaining said contact under force with closure of said one or more thumb latches by the operator and releasing said contact with the opening of said one or more thumb latches by the operator.

8. The apparatus of claim 1, wherein said housing comprises a sheet metal material.

9. Apparatus, for mounting first and second retrofit equipment modules in a mounting cabinet of a modular equipment network, the mounting cabinet being of the type in which equipment modules are inserted in the mounting cabinet in side by side orientation to engage master backplane signal connectors to a master backplane within the cabinet, said apparatus comprising:

a mini-backplane, having first and second major surfaces opposing one another and extending along a common periphery, said first major surface having at least two first signal connectors, each adapted to releasably engage a signal connector of first and second retrofit modules, said second major surface having one or more second signal connectors adapted to releasably engage one or more of said master backplane signal connectors, said first major surface further having a third signal connector being electrically connected to said first signal connectors, said second signal connectors being electrically connected to corresponding ones of said first signal connectors;

an interface module, having an interface module connector and a housing, said interface module connector adapted to engage said third signal connector, said housing including a first end wall spaced longitudinally from a second end wall, said housing further including side walls spaced transversely between said end walls; and a peripheral frame, adapted to fixedly engage said common periphery of said mini-backplane and said second end wall in a manner to fixedly position said side walls of said interface module in a substantially orthogonal orientation to said first and second major surfaces of said mini-backplane, to provide a mounting apparatus which is adapted to engage said master backplane connectors of said master backplane with said second signal connectors and to receive the first and second retrofit modules in side by side proximity with said interface module and with engagement of the signal connector of said first and second retrofit modules with a corresponding one of said first signal connectors, thereby interconnecting the first and second retrofit modules with other cabinet mounted modules.

10. The apparatus of claim 9, wherein:

said interface module further comprises a printed circuit board adapted for mounting within said housing, said housing further including a network signal connector disposed on the first end wall of said interface module near side end wall and a second interface module signal connector disposed on said far, said network signal connector being adapted to receive network signal lines external of the mounting cabinet and for providing said network signal lines through said circuit board to said interface module connector; and said first signal connectors of said mini-backplane are further adapted to releasably engage said interface module connector, and said mini-backplane is further adapted to distribute one or more of said network signals between said first signal connectors to said signal connector of each of the first and second retrofit modules, thereby providing the first and second retrofit modules with greater signal connectivity than is available through connection to the master backplane.

11. The apparatus of claim 10, wherein:

said printed circuit board is adapted to perform signal conditioning of the network signals conducted therethrough.

12. The apparatus of claim 11, wherein said signal conditioning comprises limiting the signal amplitude of the network signals to a selected magnitude.

13. The apparatus of claim 10, wherein:

said mini-backplane comprises a printed circuit board having one or more layers therein, each said of said one or more layers including one or more signal conductors for electrically interconnecting said first signal connectors to said third signal connector in a manner to provide signal interconnection of said interface module connector with each said signal connector of the first and second retrofit modules, and for electrically connecting some or all of said first signal connectors with said second signal connectors.

14. The apparatus of claim 9, wherein:

said first end wall of said interface module further includes latching means disposed thereon, said latching means being adapted for releasable engagement to a portion of the mounting cabinet to provide, when engaged, the securing of said mounting apparatus within the cabinet.

15. Apparatus of claim 14, wherein:

said latching means includes one or more thumb latches which are pivotally mounted on said first end wall and which include a latching end adapted to contact, with said apparatus inserted in the mounting cabinet, a portion of the mounting cabinet, said latching end thereafter maintaining said contact under force with closure of said one or more thumb latches and releasing said contact with the opening of said one or more thumb latches.

16. The apparatus of claim 9, wherein said housing comprises a sheet metal material.

17. Apparatus, for mounting retrofit equipment modules in a mounting cabinet of a modular equipment network, the mounting cabinet being of the type in which connectors of equipment modules are inserted in the mounting cabinet in side by side orientation to engage master backplane signal connectors coupled to a master backplane within the cabinet, said apparatus comprising:

a mini-backplane, having first and second major surfaces opposing one another and extending along a common periphery, said first major surface having one or more first signal connectors adapted to releasably engage a signal connector of a retrofit module, said second major surface having one or more second signal connectors adapted to releasably engage one or more of said master backplane signal connectors, said first major surface further having a third signal connector being electrically connected to said first signal connectors, said second signal connectors being electrically connected to corresponding ones of said first signal connectors;

an interface module, having a housing and an interface module connector adapted to engage said third signal connector; and a frame, adapted to fixedly engage said mini-backplane and said interface module in a manner to fixedly position said interface module in a substantially orthogonal orientation to said first and second major surfaces of said mini-backplane, to provide a mounting apparatus which is adapted to engage said master backplane connectors of said master backplane with said second signal connectors and to receive a retrofit module adjacent said interface module by engaging the signal connector of the retrofit module with one of said first signal connectors, thereby interconnecting the retrofit module with other cabinet mounted modules.

* * * * *